United States Patent
Kang et al.

(10) Patent No.: US 9,818,710 B2
(45) Date of Patent: Nov. 14, 2017

(54) ANCHORED INTERCONNECT

(71) Applicant: Intel Corporation, Santa Clara, CA (US)

(72) Inventors: Jiho Kang, Beaverton, OR (US); Hiten Kothari, Hillsboro, OR (US); Carole C. Montarou, Portland, OR (US); Andrew W. Yeoh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/120,788

(22) PCT Filed: Mar. 28, 2014

(86) PCT No.: PCT/US2014/032108
§ 371 (c)(1),
(2) Date: Aug. 23, 2016

(87) PCT Pub. No.: WO2015/147848
PCT Pub. Date: Oct. 1, 2015

(65) Prior Publication Data
US 2017/0069589 A1    Mar. 9, 2017

(51) Int. Cl.
*H01L 23/00*    (2006.01)
*H01L 23/31*    (2006.01)

(52) U.S. Cl.
CPC .............. *H01L 24/13* (2013.01); *H01L 24/03* (2013.01); *H01L 24/05* (2013.01); *H01L 24/11* (2013.01);
(Continued)

(58) Field of Classification Search
CPC ......... H01L 23/48; H01L 21/60; H01L 24/03; H01L 24/05; H01L 24/13; H01L 24/11;
(Continued)

(56) References Cited

U.S. PATENT DOCUMENTS 6,632,704 B2    10/2003    Kumamoto et al.
2004/0159947 A1    8/2004    Datta et al.
(Continued)

FOREIGN PATENT DOCUMENTS

JP    2002231748    8/2002
JP    2008016514    1/2008
KR    100659509    12/2006

OTHER PUBLICATIONS

International Searching Authority, "Notification of Transmittal of the International Search Report," mailed Dec. 24, 2014 in International application No. PCT/US2014/032108.

*Primary Examiner* — Alexander Oscar Williams
(74) *Attorney, Agent, or Firm* — Trop, Pruner & Hu, P.C.

(57) ABSTRACT

An embodiment includes a semiconductor structure comprising: a backend portion including a plurality of metal layers between bottom and top metal layers; the top metal layer including a top metal layer portion having first and second opposing sidewall surfaces and a top surface that couples the sidewall surfaces to one another; an insulator layer directly contacting the top surface; and a via coupling a contact bump to the top metal layer portion; wherein a first vertical axis, orthogonal to a substrate coupled to the backend portion, intercepts the contact bump, the nitride layer, the via, and the top metal layer portion. Other embodiments are described herein.

23 Claims, 7 Drawing Sheets

(52) U.S. Cl.
CPC .............. *H01L 23/3192* (2013.01); *H01L 2224/03831* (2013.01); *H01L 2224/0401* (2013.01); *H01L 2224/05557* (2013.01); *H01L 2224/05567* (2013.01); *H01L 2224/05624* (2013.01); *H01L 2224/05647* (2013.01); *H01L 2224/13018* (2013.01); *H01L 2224/13022* (2013.01); *H01L 2224/13025* (2013.01); *H01L 2924/35121* (2013.01)

(58) Field of Classification Search
CPC ......... H01L 23/3192; H01L 2224/0401; H01L 2224/05567; H01L 2224/13022; H01L 2224/13018; H01L 2924/00012; H01L 2224/05647; H01L 2924/00014; H01L 2224/03831
USPC ............................. 257/773, 774, 778, 765
See application file for complete search history.

(56) References Cited

U.S. PATENT DOCUMENTS

| | | | |
|---|---|---|---|
| 2009/0114431 A1 | 5/2009 | Kuroda et al. | |
| 2012/0306084 A1* | 12/2012 | Wood ............... | H01L 21/76898 257/761 |
| 2014/0210098 A1* | 7/2014 | Jezewski ............... | H01L 23/562 257/774 |
| 2015/0255410 A1* | 9/2015 | Filippi ................... | H01L 24/05 257/774 |

* cited by examiner

400

---

Forming a frontend portion, including a device layer, on a substrate.
405

↓

Forming a plurality of metal layers on the frontend portion.
410

↓

Forming a top metal layer on the plurality of metal layers; the top metal layer including a top metal layer portion having first and second opposing sidewall surfaces and a top surface that couples the sidewall surfaces to one another.
415

↓

Forming a nitride layer on the top surface.
420

↓

Forming a via on top of the top metal layer portion.
425

↓

Forming a contact bump on a via.
430

Figure 4

ANCHORED INTERCONNECT

TECHNICAL FIELD

Embodiments of the invention are in the field of semiconductor devices and, in particular, interconnects.

BACKGROUND

Traditionally, semiconductor chips have been electrically coupled to electrical traces on a substrate via wire interconnects that are soldered on one end to the top active area of the chip and soldered to trace pads on the substrate that surround the chip on the other end. These types of interconnects are not particularly efficient, requiring space for both the surface area of the chip and a perimeter region for the trace pads, resulting in larger chip packages. To more efficiently utilize the substrate surface and facilitate smaller chip packages, the flip chip interconnection process was developed. Essentially, the active surface of the semiconductor chip is flipped over to face the substrate and the chip is soldered directly to trace pads located adjacent to the active surface. The result is a more compact and space-efficient package.

One of the most successful and effective methods of electrically connecting a flipped chip utilizes controlled-collapse chip connection technology (C4). First, solder bumps are applied to pads on the active side of the chip, the substrate or both. Next, the solder bumps are melted and permitted to flow, ensuring that the bumps are fully wetted to the corresponding pads on the chip or substrate. A tacky flux is typically applied to one or both of the surfaces to be joined. The flux-bearing surfaces of the chip and substrate are then placed in contact with each other in general alignment. A reflow is performed by heating the chip and substrate package to or above the solder's melting point. The solder on the chip and the substrate combine and the surface tension of the molten solder causes the corresponding pads to self-align with each other. The joined package is then cooled to solidify the solder. The resulting height of the solder interconnects is determined based on a balance between the surface tension of the molten solder columns and the weight of the chip. Any flux or flux residue is removed from the chip and substrate combination in a defluxing operation. Finally, an epoxy underfill is applied between the bottom surface of the chip and the top surface of the substrate, surrounding and supporting the solder columns. The reliability and fatigue resistance of the chip substrate solder connection is increased significantly. The underfill acts to carry a significant portion of the thermal loads induced by coefficient of thermal expansion (CTE) differences between the chip and substrate, rather than having all the thermal load transferred through the solder columns.

BRIEF DESCRIPTION OF THE DRAWINGS

It is Features and advantages of embodiments of the present invention will become apparent from the appended claims, the following detailed description of one or more example embodiments, and the corresponding figures, in which:

FIG. 2b includes a magnified view of the embodiment of FIG. 2a.

FIG. 4 includes a method of forming an anchored embodiment in an embodiment of the invention.

DETAILED DESCRIPTION

Figure 1A:
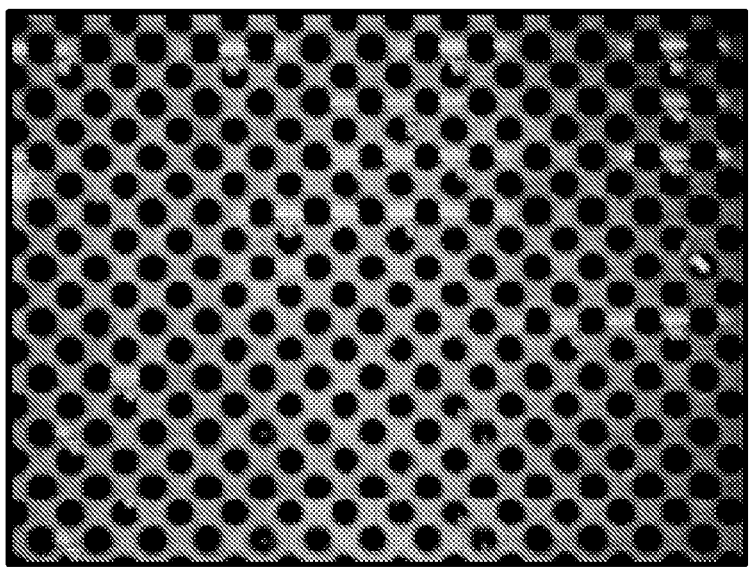
FIG. 1a depicts delamination of a conventional top metal layer and FIG. 1b depicts a significant decrease of delamination of a top metal layer in an embodiment of the invention.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

In the above "Background" section the addition of solder bumps to pads is discussed generally. The addition of solder bump to pads is now discussed in a more detail and in an effort to set out the context surrounding the coupling of these components.

Specifically, the addition of solder bump to pads occurs near the end of the "Back End of Line Processing". More specifically, once a semiconductor device (e.g., a portion of a device include transistors or other switching devices) has been created it must be interconnected to form a desired electrical circuit. This "Back End of Line Processing" involves depositing various layers of metal and insulating material in the desired pattern. Typically the metal layers consist of aluminum, copper, and the like. The insulating material may include $SiO_2$, low-K materials, and the like. The various metal layers are interconnected by interconnects, which may include a line portion and a via portion. Vias may be formed by etching holes in the insulating material and depositing metal (e.g., Tungsten) in them. The line portion may be formed by etching trenches in the insulating material and depositing metal in them. A final portion of this process may include the aforementioned coupling of solder bumps to pads. The pads may be included in or coupled to one of the metal layers.

Once the Back End of Line Processing has been completed, the semiconductor device is subjected to a variety of End-of-Line electrical tests to determine if its functions properly. End-of-Line reliability requirements, such as thermal stress b-HAST test, are becoming more and more stringent as processing and corresponding testing technologies advance. The acronym "HAST" stands for "Highly Accelerated Temperature/Humidity Stress Test." The test was developed as a shorter alternative to Temperature Humidity Bias (THB) Testing. If THB testing takes 1000 hours to complete, HAST results are available within 96-100 hours. Because of this, the popularity of HAST has continuously increased in recent years.

Applicant has identified a concern regarding delamination that is discovered during End-of-Line testing. For example, a thick via 9 delamination occurs, which results in b-HAST test failures. A "via 9" refers to a via formed in the $9^{th}$ metal layer (i.e., metal 9 layer).

An embodiment of the invention solves this delamination that occurs in the uppermost metal layer (or among the uppermost metal layers) of a semiconductor device. The embodiment includes a metal anchor situated below a via in the highest metal layer to hold the via steady in case of excessive stress placed on the via (or a member, such as a solder ball, connected to the via), contamination weakens the via, and the like. An embodiment includes a metal 9 anchor (an anchor in the metal 9 (M9) layer) situated below via 9 (via coupled to the M9 layer such as, for example, on top of the M9 layer) to support the via 9 in case of excessive stress placed on the via (or a member, such as a solder ball, connected to the via), contamination weakens the via, and the like. An embodiment may include an anchor for a Through Silicon Via (TSV) (e.g., a via etched through a wafer to allow a wafer-to-wafer interconnect scheme compatible with 3D wafer-level packaging) in metal redistribution layers that interconnect logic to memory (LMI) dies.

A series of figures are now discussed to illustrate some of the aforementioned concepts and embodiments.

Figure 1B:
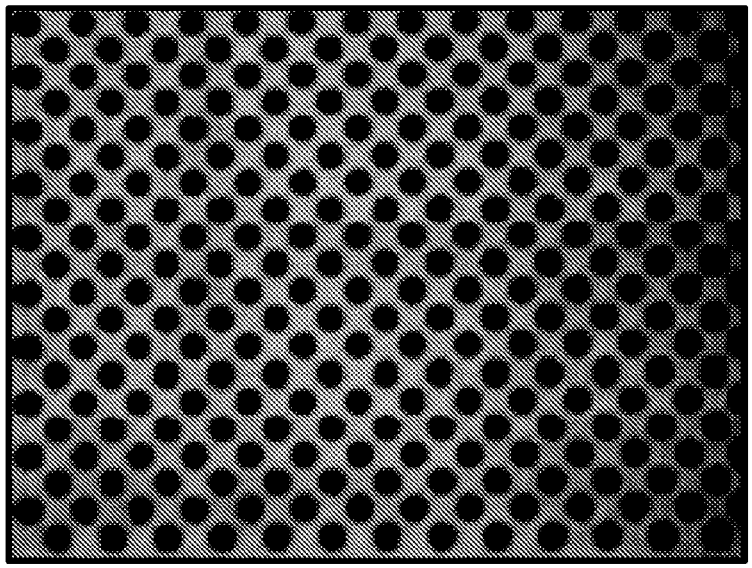

FIG. 1a depicts delamination of a conventional top metal layer. There are numerous locations that are lighter than their surroundings. These lighter areas exist where delamination of the top metal layer has occurred due to stress placed on one or more contact bumps nearby the areas of delamination. FIG. 1b depicts a significant decrease of delamination of a top metal layer in an embodiment of the invention. Details regarding embodiments that result in decreased top layer delamination are addressed next.

Figure 2A:
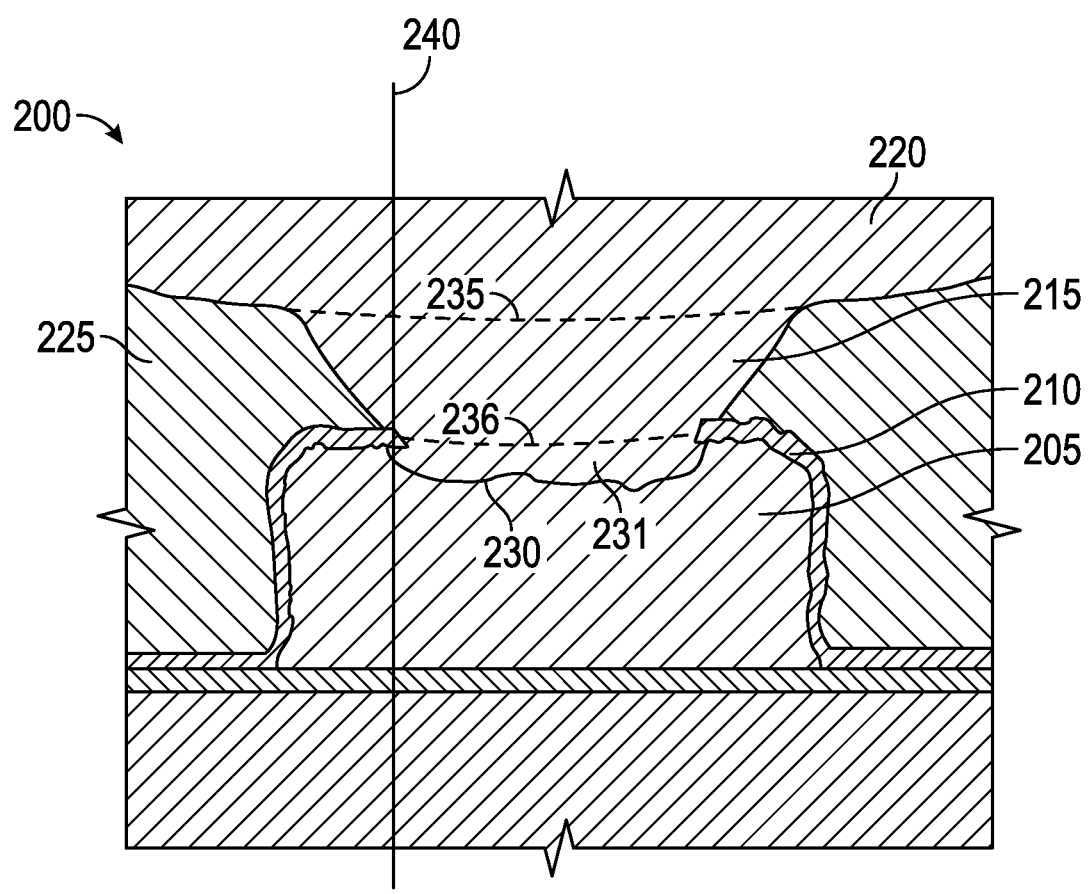
FIG. 2a includes an anchored interconnect in an embodiment of the invention.
Figure 2B:
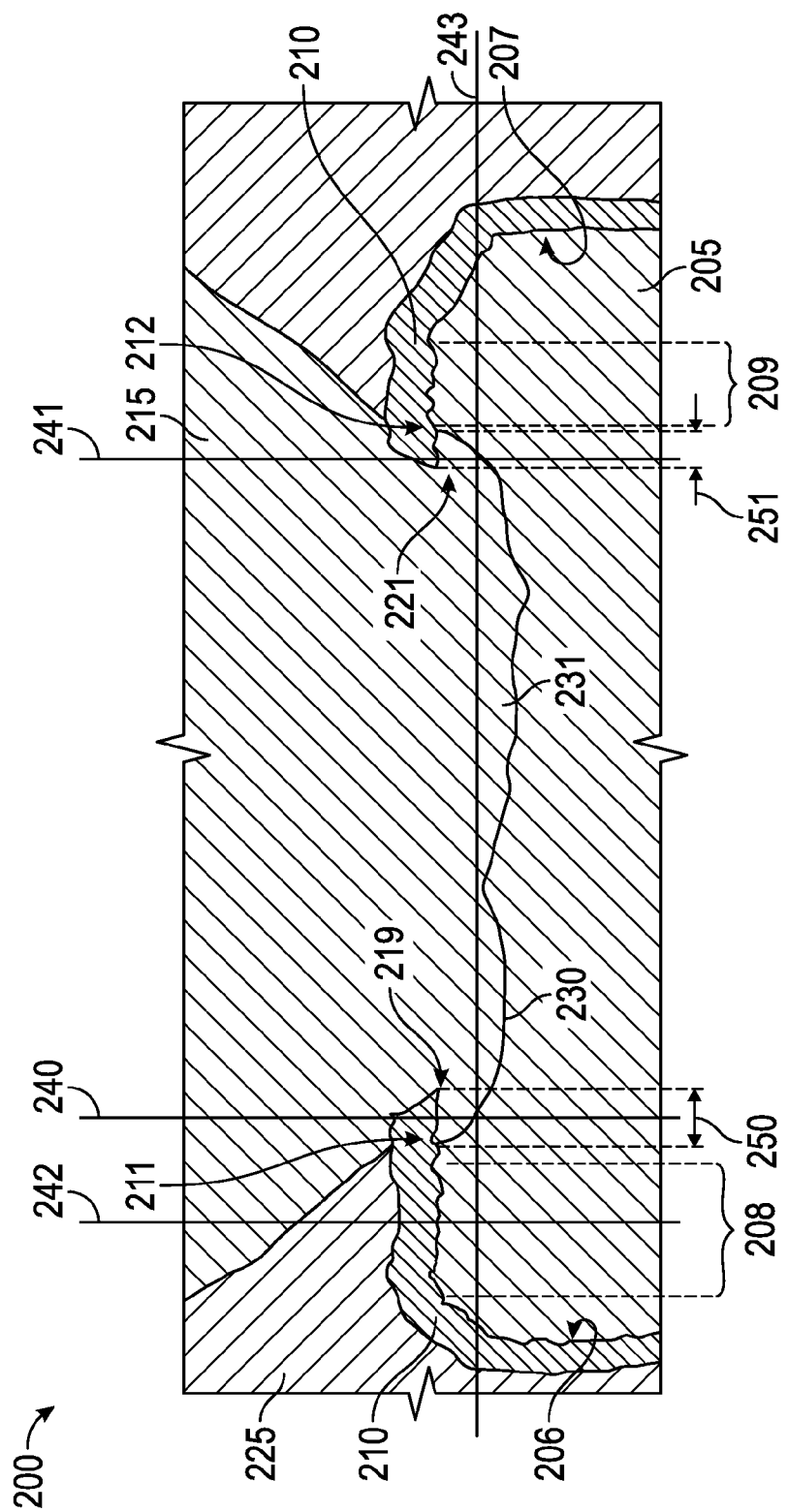
Figure 3A:
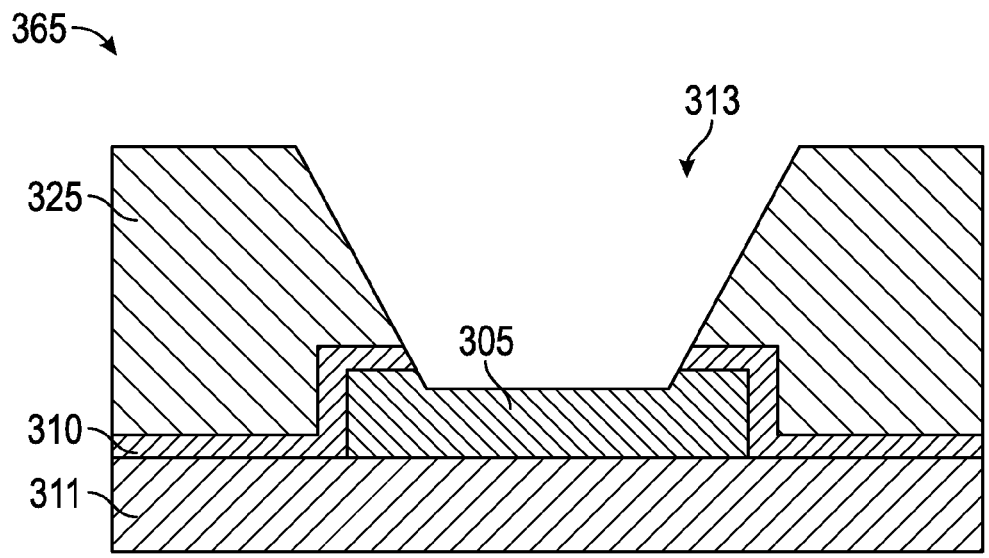
FIGS. 3a-3e include a method of forming an anchored embodiment in an embodiment of the invention.
Figure 3B:
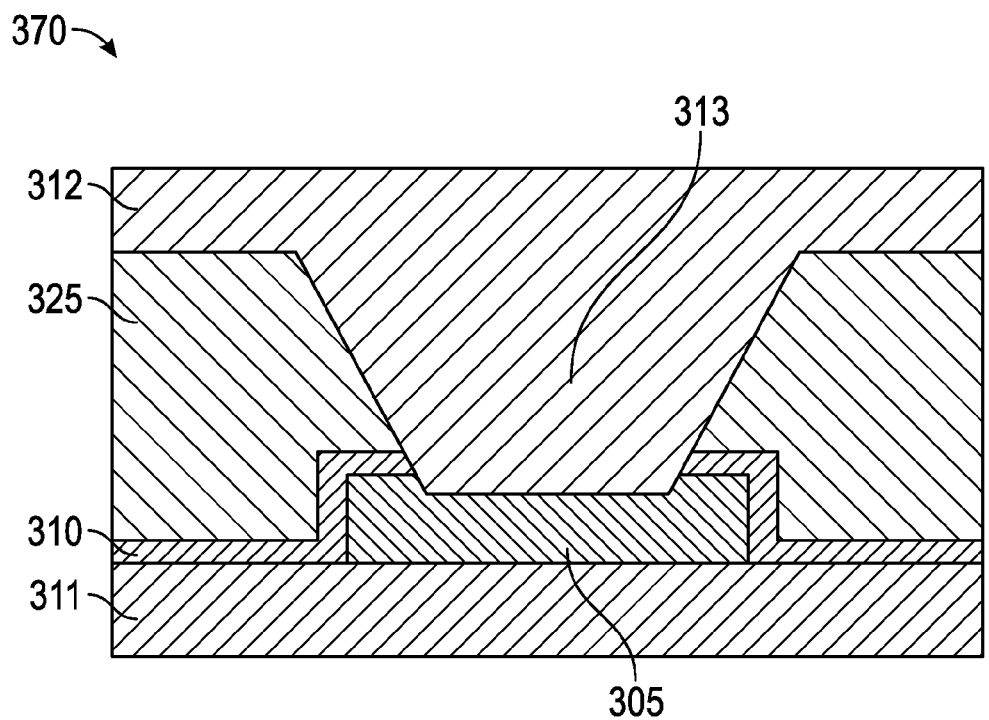
Figure 3C:
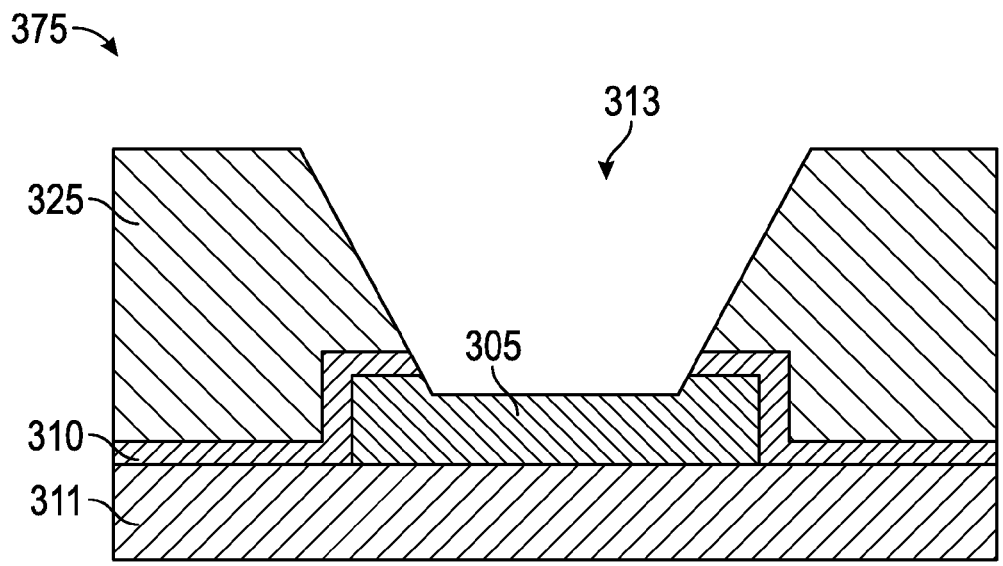
Figure 3D:
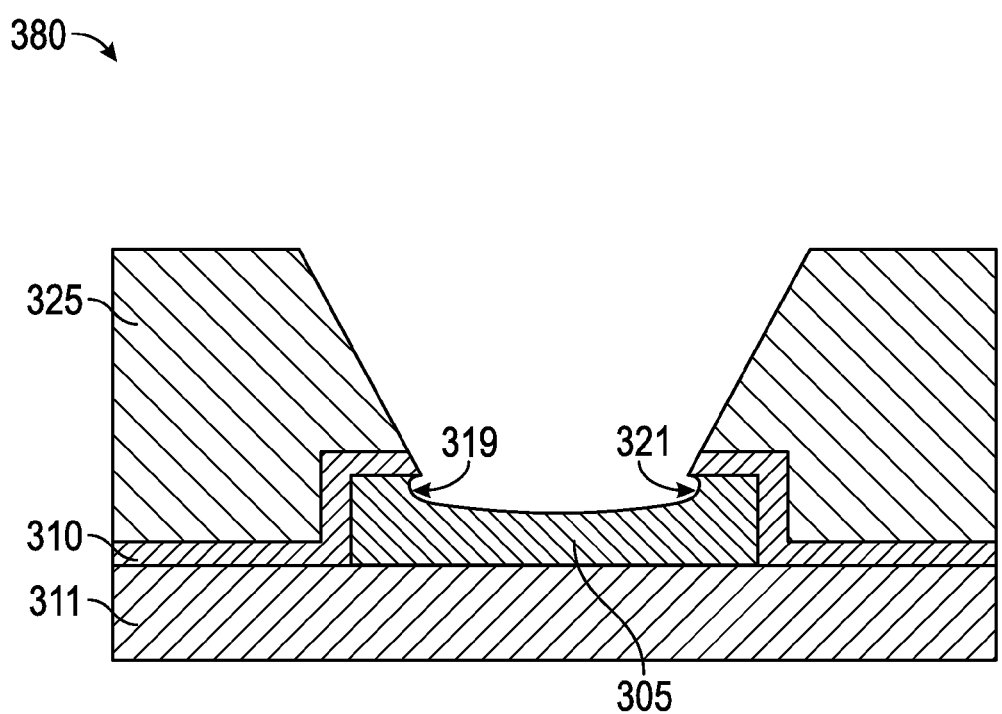
Figure 3E:
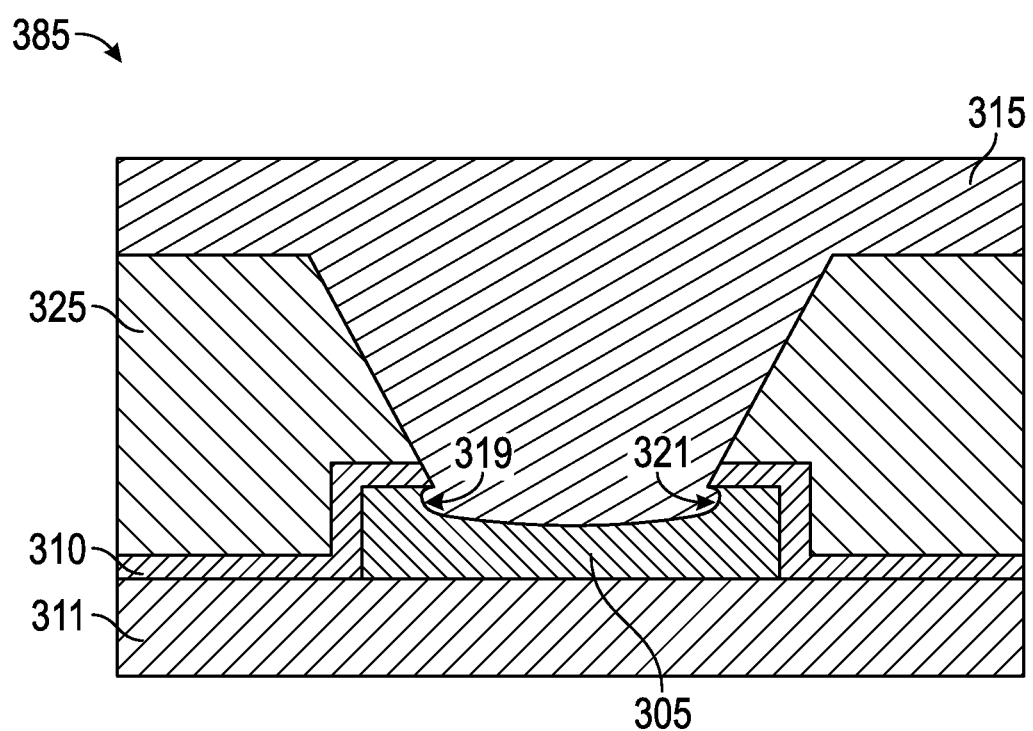

FIG. 2a includes an anchored interconnect in an embodiment of the invention. FIG. 2b includes a magnified view of the embodiment of FIG. 2a.

Semiconductor structure 200 may comprise several elements not shown for sake of clarity. For example, structure 200 may include a frontend portion including a device layer on a substrate. The device layer may include transistors, switching devices, and the like. Structure 200 may also include a backend portion including a bottom metal layer and a plurality of metal layers on top of the bottom metal layer. As a person having ordinary skill in the art will appreciate, the backend portion includes no metal layer between the bottom metal layer and a top of the frontend portion. Furthermore, the backend portion includes no metal layer between the top metal layer and the top of the backend portion.

FIGS. 2a and 2b show a top metal layer (which is on the plurality of metal layers mentioned above) including a top metal layer portion 205 having first and second opposing sidewall surfaces 206, 207 and a top surface (including portions 208, 209) that couples the sidewall surfaces to one another.

Structure 200 also includes nitride layer 210 directly contacting the top surface directly adjacent the first sidewall surface at a first location, such as location 211, and directly contacting the top surface directly adjacent the second sidewall surface at a second location, such as location 212.

Structure 200 further includes contact bump 220 and via 215 coupling contact bump 220 to the top metal layer portion 205. Note that due to magnification FIG. 2b does not show bump 220 but instead shows a portion of the via 215 before the via contact the bump (as shown in FIG. 2a).

In an embodiment, via 215 directly contacts the top metal layer portion 205 directly beneath the nitride layer 210 at both of the first and second locations 211, 212. As those having ordinary skill in the art will appreciate, a via includes a hole etched in an interlayer dielectric, such as dielectric 225 (e.g., $SiO_2$ and/or $Si_3N_4$), which is then filled with metal (e.g., tungsten), to provide a connection between metal portions such as top metal layer 205 and contact bump 220. In an embodiment top metal layer portion 205 includes any of an interconnect line, a contact pad, and the like.

In an embodiment via 215 directly interfaces the top surface of portion 205 along a curved line 230 that extends from the first location 211 to the second location 212. Thus, a conventional via may be thought to be limited to the space between lines 235, 236 with the line interconnect extending from line 236 downwards. However, in an embodiment via 215 extends below line 236 and into area 231 (an area typically associated with the interconnect line). This is due to a removal (e.g., using an etching step described more fully in FIG. 3) of a portion of metal layer 205 before via 215 is formed. In an embodiment curved line 230 is "generally parabolic", which is to say the line is not necessarily perfectly smooth. The generally parabolic line 230 has a parabolic vertex (i.e., the point where the parabola crosses its axis of symmetry) located directly below via 215 and contact bump 220 and located between the first and second locations 211, 212 and the substrate (not shown). In FIG. 2a the vertex is located approximately at the bottom-most portion of line 230. Notably, line 230 is not just a line used for illustration (such as lines 235, 236). Line 230 depicts an actual physical interface that exists between via 215 and top metal layer portion 205.

Line 230 illustrates how via 215 actually extends under portions of nitride 210 to form an "interconnect anchor" with undercut areas 219, 221. In an embodiment the amount via 215 undercuts nitride 210 is illustrated by distances 250, 251. Distances 250, 251 may be equal or may be unequal. In an embodiment, distance 250 is 1.0 micron but in other embodiments it may be 0.3, 0.4, 0.5, 0.6, 0.7, 0.8, 0.9, 1.1, 1.2, 1.3, 1.4, 1.5, 1.6 microns or more. In an embodiment, distance 251 is 0.6 microns but in other embodiments it may be 0.3, 0.4, 0.5, 0.7, 0.8, 0.9, 1.0, 1.1, 1.2, 1.3, 1.4, 1.5, 1.6 microns or more.

Various axes help illustrate characteristics of some embodiments. For example, a first vertical axis 240, orthogonal to the substrate (not shown) upon which the metal layer 205 and the other underlying metals layers are formed, intercepts the contact bump 220, the nitride layer 210, the via 215, and the top metal layer portion 205. This axis may not necessarily contact dielectric 225. The same is true for axis 241. In an embodiment a second vertical axis 242, orthogonal to the substrate, intercepts the contact bump 220, the nitride layer 210, a dielectric 225, and the top surface 208. Although not shown, another vertical axis, orthogonal to the substrate, would intercept the contact bump 220, the nitride layer 210, dielectric 225, and the top surface 209. In an embodiment, a horizontal axis 243, orthogonal to the first vertical axis 240, intercepts the nitride layer 210, the first and second sidewall surfaces 206, 207, and the via 215. For example, the axis 243 intercepts the via 215 in area 231. Thus, in an embodiment axis 243 intercepts both the via 215 and the top metal layer portion 205.

FIGS. 3a-3e include a method of forming an anchored embodiment in an embodiment of the invention. In block 365 a space 313 is formed within dielectric 325 and on top of top metal layer (e.g., M9 layer) portion 305. Nitride layer 310 is between dielectric 325 and metal portion 305. Metal portion 305 is on top of another layer 311. Layer 311 may be any of various types of layers, such as a dielectric layer and the like. Layer 311 may be formed on top of many other layers that are not shown, such as multiple metal and dielectric layers of the backend, which may be formed on the frontend device layer and substrate.

In block 370 photoresist (PR) 312 is applied over dielectric 325 and into space 313 as well as on other portions of device to the left and right of what is shown in block 370. In block 375 this PR is removed in space 313 but left on other portions of the device that do not need to undergo the etch process of ensuing steps. In block 380 the aforementioned etch step occurs to create the undercut areas 319, 321 below nitride 310 and dielectric 325. In block 385 metal fills the etched space for form the anchored interconnect comprising via 315. In an embodiment this process may be used to form a "metal 9" ($9^{th}$ metal layer) anchor or foot by dipping wafers into a wet etch toolset (e.g., block 380). The anchor or foot then acts to hold the "via 9" (via that couples to the $9^{th}$ metal layer) after via 9 has been patterned and dielectric 325 has been cured.

Dielectric 325 may include a photodefinable low shrinkage polymer, which generally has shrinkage during cure (for example, thermal cure at 250 degrees Celsius for one hour) of about fifteen percent or less. Polymers fitting the description of low-shrinkage photodefinable polymer are: novolak resins and poly(hydroxystyrene) (PHS) available commercially under the trade name WPR including WPR-1020, WPR-1050, and WPR-1201. (WPR is a registered trademark of JSR Corporation, Tokyo, Japan).

FIG. 4 includes a method 400 of forming an anchored embodiment in an embodiment of the invention. Block 405 includes forming a frontend portion, including a device layer, on a substrate. Block 410 includes forming a plurality of metal layers on the frontend portion. Block 415 includes forming a top metal layer on the plurality of metal layers; the top metal layer including a top metal layer portion having first and second opposing sidewall surfaces and a top surface that couples the sidewall surfaces to one another. Block 420 includes forming a nitride layer on the top surface. Block 425 includes forming a via on top of the top metal layer portion. Block 430 includes forming a contact bump on the via. The process produces a device wherein a first vertical axis, orthogonal to the substrate, intercepts the contact bump, the nitride layer, the via, and the top metal layer portion.

Various embodiments include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes A semiconductor structure comprising: a frontend portion including a device layer on a substrate; a backend portion including a bottom metal layer, a top metal layer, and a plurality of metal layers between the bottom and top metal layers; the top metal layer including a top metal layer portion having first and second opposing sidewall surfaces and a top surface that couples the sidewall surfaces to one another; a nitride layer directly contacting the top surface directly adjacent the first sidewall surface at a first location and directly contacting the top surface directly adjacent the second sidewall surface at a second location; and a contact bump and a via coupling the contact bump to the top metal layer portion; wherein (a) the backend portion includes no metal layer between the bottom metal layer and a top of the frontend portion; (b) the backend portion includes no metal layer between the top metal layer and the top of the backend portion; and (c) the via directly contacts the top metal layer portion directly beneath the nitride layer at both of the first and second locations.

In an embodiment the top metal layer portion includes copper but in other embodiments may include tungsten and/or aluminum or other conductors. In an embodiment the via may include copper and/or aluminum but in other embodiments may include tungsten or other conductors. In an embodiment contact bump includes copper but in other embodiments may include tungsten, aluminum, lead, and/or tin or other conductors.

In example 2 the subject matter of the Example 1 can optionally include wherein the via directly interfaces the top surface along a curved line that extends from the first location to the second location.

In example 3 the subject matter of the Examples 1-2 can optionally include wherein the top metal layer portion includes an interconnect line.

In example 4 the subject matter of the Examples 1-3 can optionally include wherein the curved line is generally parabolic having a parabolic vertex located directly below the via and the contact bump and located between the first and second locations and the substrate.

In example 5 the subject matter of the Examples 1-4 can optionally include wherein a first vertical axis, orthogonal to the substrate, intercepts the contact bump, the nitride layer, the via, and the top metal layer portion.

In example 6 the subject matter of the Examples 1-5 can optionally include wherein a second vertical axis, orthogonal to the substrate, intercepts the contact bump, the nitride layer, a dielectric, and the top surface.

In example 7 the subject matter of the Examples 1-6 can optionally include wherein a horizontal axis, orthogonal to the first vertical axis, intercepts the nitride layer, the first and second sidewall surfaces, and the via.

Example 8 includes semiconductor structure comprising: a backend portion including a plurality of metal layers between bottom and top metal layers; the top metal layer including a top metal layer portion having first and second opposing sidewall surfaces and a top surface that couples the sidewall surfaces to one another; an insulator layer directly contacting the top surface; and a via coupling a contact bump to the top metal layer portion; wherein a first vertical axis, orthogonal to a substrate coupled to the backend portion, intercepts the contact bump, the nitride layer, the via, and the top metal layer portion.

In example 9 the subject matter of the Example 8 can optionally include wherein the via directly contacts the top metal layer portion directly beneath the nitride layer at first and second locations.

In example 10 the subject matter of the Examples 8-9 can optionally include wherein the via directly interfaces the top surface along a curving line that extends from the first location to the second location.

In example 11 the subject matter of the Examples 8-10 can optionally include wherein the curving line is generally parabolic having a parabolic vertex located directly below the via and the contact bump and located between the first and second locations and the substrate.

In example 12 the subject matter of the Examples 8-11 can optionally include wherein the top metal layer portion includes an interconnect line.

In example 13 the subject matter of the Examples 8-12 can optionally include wherein a second vertical axis, orthogonal to the substrate, intercepts the contact bump, the nitride layer, a dielectric, and the top surface.

In example 14 the subject matter of the Examples 8-13 can optionally include wherein a horizontal axis, orthogonal to the first vertical axis, intercepts the nitride layer, the first and second sidewall surfaces, and the via.

In example 15 the subject matter of the Examples 8-14 can optionally include wherein a horizontal axis, orthogonal to the first vertical axis, intercepts the nitride layer, the first and second sidewall surfaces, and the via.

In example 16 the subject matter of the Examples 8-15 can optionally include wherein the insulator includes a nitride. For example, silicon nitride may be used as an insulator and chemical barrier/passivation layer. Other insulators may include ($SiN_xH_y$), silicon dioxide, and the like.

Example 17 includes a method comprising: forming a frontend portion, including a device layer, on a substrate; forming a plurality of metal layers on the frontend portion; forming a top metal layer on the plurality of metal layers; the top metal layer including a top metal layer portion having first and second opposing sidewall surfaces and a top surface that couples the sidewall surfaces to one another; forming a nitride layer on the top surface; forming a via on top of the top metal layer portion; forming a contact bump on the via; wherein a first vertical axis, orthogonal to the substrate, intercepts the contact bump, the nitride layer, the via, and the top metal layer portion.

In example 18 the subject matter of the Example 17 can optionally include wherein the via directly contacts the top metal layer portion directly beneath the nitride layer at first and second locations.

In example 19 the subject matter of the Examples 17-18 can optionally include wherein the via directly interfaces the top surface along a curving line that extends from the first location to the second location.

In example 20 the subject matter of the Examples 17-19 can optionally include wherein the curving line is generally parabolic having a parabolic vertex located directly below the via and the contact bump and located between the first and second locations and the substrate.

In example 21 the subject matter of the Examples 17-20 can optionally include wherein the top metal layer portion includes an interconnect line.

In example 22 the subject matter of the Examples 17-21 can optionally include wherein a second vertical axis, orthogonal to the substrate, intercepts the contact bump, the nitride layer, a dielectric, and the top surface.

In example 23 the subject matter of the Examples 17-22 can optionally include wherein a horizontal axis, orthogonal to the first vertical axis, intercepts the nitride layer, the first and second sidewall surfaces, and the via.

In example 24 the subject matter of the Examples 17-23 can optionally include wherein a horizontal axis, orthogonal to the first vertical axis, intercepts the nitride layer, the first and second sidewall surfaces, and the via.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A semiconductor structure comprising:
    a frontend portion including a device layer on a substrate;
    a backend portion including a bottom metal layer, a top metal layer, and a plurality of metal layers between the bottom and top metal layers; the top metal layer including a top metal layer portion having first and second opposing sidewall surfaces and a top surface that couples the sidewall surfaces to one another;
    a nitride layer directly contacting the top surface directly adjacent the first sidewall surface at a first location and directly contacting the top surface directly adjacent the second sidewall surface at a second location; and
    a contact bump and a via coupling the contact bump to the top metal layer portion;
    wherein (a) the backend portion includes no metal layer between the bottom metal layer and a top of the frontend portion; (b) the backend portion includes no metal layer between the top metal layer and the top of the backend portion; (c) the via directly contacts the top metal layer portion directly beneath the nitride layer at both of the first and second locations; (d) a first vertical axis, orthogonal to the substrate, intercepts the contact bump, the nitride layer, the via, and the top metal layer portion; and (e) a second vertical axis, orthogonal to the substrate, intercepts the contact bump, the nitride layer, a dielectric, and the top surface.

2. The structure of claim 1, wherein the via directly interfaces the top surface along a curved line that extends from the first location to the second location.

3. The structure of claim 2, wherein the top metal layer portion includes an interconnect line.

4. The structure of claim 2, wherein the curved line is generally parabolic having a parabolic vertex located directly below the via and the contact bump and located between the first and second locations and the substrate.

5. The structure of claim 1, wherein a horizontal axis, orthogonal to the first vertical axis, intercepts the nitride layer, the first and second sidewall surfaces, and the via.

6. A semiconductor structure comprising:
a backend portion including a plurality of metal layers between bottom and top metal layers; the top metal layer including a top metal layer portion having first and second opposing sidewall surfaces and a top surface that couples the sidewall surfaces to one another;
an insulator layer directly contacting the top surface; and
a via coupling a contact bump to the top metal layer portion;
wherein (a) a first vertical axis, orthogonal to a substrate coupled to the backend portion, intercepts the contact bump, the insulator layer, the via, and the top metal layer portion, (b) the first vertical axis intersects the via above the insulator layer and below the insulator layer.

7. The structure of claim 6, wherein the via directly contacts the top metal layer portion directly beneath the insulator layer at first and second locations.

8. The structure of claim 7, wherein the via directly interfaces the top surface along a curving line that extends from the first location to the second location.

9. The structure of claim 8, wherein the curving line is generally parabolic having a parabolic vertex located directly below the via and the contact bump and located between the first and second locations and the substrate.

10. The structure of claim 6, wherein the top metal layer portion includes an interconnect line.

11. The structure of claim 6, wherein:
a second vertical axis, orthogonal to the substrate, intercepts the contact bump, the insulator layer, a dielectric, and the top surface; and
the insulator layer is between the dielectric and the top surface.

12. The structure of claim 11, wherein:
a horizontal axis, orthogonal to the first vertical axis, intercepts the insulator layer, the first and second sidewall surfaces, the dielectric, and the via; and
the dielectric includes a member selected from the group consisting of an oxide, a nitride, or a photodefinable polymer.

13. The structure of claim 6, wherein a horizontal axis, orthogonal to the first vertical axis, intercepts the insulator layer, the first and second sidewall surfaces, and the via.

14. The structure of claim 6, wherein the insulator layer includes a nitride.

15. A method comprising:
forming a frontend portion, including a device layer, on a substrate;
forming a plurality of metal layers on the frontend portion;
forming a top metal layer on the plurality of metal layers; the top metal layer including a top metal layer portion having first and second opposing sidewall surfaces and a top surface that couples the sidewall surfaces to one another;
forming a nitride layer on the top surface;
forming a via on top of the top metal layer portion;
forming a contact bump on the via;
wherein (a) a first vertical axis, orthogonal to the substrate, intercepts the contact bump, the nitride layer, the via, and the top metal layer portion, and (b) the via includes a member selected from the group consisting of copper, aluminum, or tungsten.

16. The method of claim 15, wherein the via directly contacts the top metal layer portion directly beneath the nitride layer at first and second locations.

17. The method of claim 16, wherein the via directly interfaces the top surface along a curving line that extends from the first location to the second location.

18. The method of claim 17, wherein the curving line is generally parabolic having a parabolic vertex located directly below the via and the contact bump and located between the first and second locations and the substrate.

19. The method of claim 15, wherein the top metal layer portion includes an interconnect line.

20. The method of claim 15, wherein a second vertical axis, orthogonal to the substrate, intercepts the contact bump, the nitride layer, a dielectric, and the top surface.

21. The method of claim 15, wherein a horizontal axis, orthogonal to the first vertical axis, intercepts the nitride layer, the first and second sidewall surfaces, and the via.

22. The structure of claim 1, wherein a portion of the dielectric that intercepts the second vertical axis is between the nitride layer and the via.

23. The structure of claim 12, wherein the photodefinable polymer includes a member selected from the group consisting of a novolak resin or poly(hydroxystyrene).

* * * * *